US010088517B2

(12) United States Patent
Swamy et al.

(10) Patent No.: US 10,088,517 B2
(45) Date of Patent: Oct. 2, 2018

(54) VOLTAGE SOURCE INVERTER FILTER WITH RESISTOR FAILURE DETECTION CIRCUIT

(71) Applicant: Yaskawa America, Inc., Waukegan, IL (US)

(72) Inventors: Mahesh M. Swamy, Gurnee, IL (US); Mark Baumgardner, New Berlin, WI (US); Steven Hartig, Milwaukee, WI (US); Daniel Nitzsche, Oconomowoc, WI (US)

(73) Assignee: Yaskawa America, Inc., Waukegan, IL (US)

( * ) Notice: Subject to any disclaimer, the term of this patent is extended or adjusted under 35 U.S.C. 154(b) by 0 days.

(21) Appl. No.: 15/288,759

(22) Filed: Oct. 7, 2016

(65) Prior Publication Data

US 2018/0100889 A1 Apr. 12, 2018

(51) Int. Cl.
*H02P 27/06* (2006.01)
*G01R 31/28* (2006.01)

(52) U.S. Cl.
CPC .............................. *G01R 31/2843* (2013.01)

(58) Field of Classification Search
CPC ....... B65G 1/137; B65G 1/1373; B65G 65/00
See application file for complete search history.

(56) References Cited

U.S. PATENT DOCUMENTS

| | | | | |
|---|---|---|---|---|
| 5,852,558 A * | 12/1998 | Julian | ..................... | H02M 1/12 363/132 |
| 6,122,184 A * | 9/2000 | Enjeti | .................. | H02M 1/126 363/47 |
| 8,325,500 B2 * | 12/2012 | Schueneman | ......... | H02M 1/126 363/47 |
| 2005/0151658 A1 * | 7/2005 | Kono | .................... | B60L 3/0023 340/647 |
| 2007/0120607 A1 * | 5/2007 | Pelly | ....................... | H02M 1/12 330/302 |
| 2011/0050135 A1 * | 3/2011 | Higuchi | ................ | H02M 1/126 318/400.2 |
| 2013/0241451 A1 * | 9/2013 | Wei | ......................... | H02J 9/005 318/400.3 |
| 2015/0054443 A1 * | 2/2015 | Swamy | .................. | H02P 27/16 318/504 |
| 2015/0102882 A1 * | 4/2015 | Shudarek | ................. | H01F 3/14 336/10 |

OTHER PUBLICATIONS

A New Normal Mode dv/dt Filter With Resistor Failure Detection Circuit byMark Baumgardner Yaskawa America, Inc.Waukegan, IL USA mark_baumgardner@yaskawa.com Mahesh Swamy Yaskawa America, Inc. Waukegan, IL USA.*

* cited by examiner

*Primary Examiner* — Muhammad S Islam
(74) *Attorney, Agent, or Firm* — Wood, Phillips, Katz, Clark & Mortimer

(57) ABSTRACT

A motor drive system output filter includes fault detection. A variable frequency drive (VFD) drives a three phase AC induction motor. A filter circuit is connected between the VFD and the AC induction motor. The filter circuit comprises a filter for each phase. Each filter comprises an inductor and a damping resistor connected in series with a blocking capacitor across the inductor. A plurality of detection circuits are provided, one for each phase. Each detection circuit is connected to the capacitor of the associated phase for detecting capacitor voltage to indicate a resistor fault condition.

20 Claims, 6 Drawing Sheets

VOLTAGE SOURCE INVERTER FILTER WITH RESISTOR FAILURE DETECTION CIRCUIT

FIELD OF THE INVENTION

This application relates to motor drive systems and, more particularly, to a voltage source inverter filter with a resistor failure detection circuit.

BACKGROUND OF THE INVENTION

Variable Frequency Drives (VFDs) frequently use Insulated Gate Bipolar Transistors (IGBTs) which may be replaced by wide band gap devices (SiC and GaN) as the ultimate choice for power semi-conductor switches in Voltage Source Inverters. These devices have extremely fast rise time and fall time in the order of nanoseconds compared to microseconds in the presently used IGBT devices. The fast rise time and fall time result in extremely high dv/dt of the output voltage being fed to an AC motor. The high dv/dt causes significant leakage current that can cause premature failure in the cables carrying power to the AC motor. When the distance between the motor and the inverter is long and there exists a mismatch between the cable and motor surge impedance, there is voltage amplification at the motor terminals due to the high dv/dt. This is attributed to a phenomenon known as "Voltage Reflection". The high dv/dt of PWM outputs has been found to create excessive voltage stress in the insulation system of AC motors. An effective technique of mitigating over-voltage at motor terminals and reduce leakage current in motor cables and through the frame of the AC motor is by employing an output dv/dt filter.

In many oil field applications, the distance between the motor and the Variable Frequency Drive (VFD) approaches 300 m. Traditional dv/dt filters have been found to be inadequate in reducing the over voltage at the motor terminals. The damping resistor often experiences high voltage and gets damaged.

In practice, the over-voltage at the motor terminals, which depends on the distance between the motor and the inverter as well as on the impedance mismatch between the cable and the motor surge impedance, can reach as high as double the DC bus voltage of the inverter. In certain cases, due to very short transition time between modulating pulses, the peak transient appearing across the motor windings can be as high as three times the DC bus voltage. The high rate of rise of voltage pulses in the range of a few tens of nanoseconds give rise to voltage reflection phenomenon that can cause high voltage transients to appear across motor terminals that eventually leads to damage of insulation and consequently failure.

The high dv/dt at the output of PWM inverters has been shown to cause two distinct types of problems in a motor insulation system. The first type of problem can manifest itself as an insulation breakdown of the first few turns of the winding. This is purely due to the high voltage gradient applied across the first few turns of the winding. The second type of problem encountered is pinholes in the insulation due to corona discharge caused by high dv/dt of the applied voltage.

The phenomenon of reflection of electromagnetic waves on an electrical conductor is similar to a wave in water. At a given point, the magnitude of the electromagnetic wave varies with time and its phase is retarded. If a load on a transmission line is physically at infinite distance from the source, there exists no reflection. One can electrically create an infinite transmission line (a line having no reflection) if the surge impedance at the terminating end matches the cable surge impedance. However, in most cases the motor and cable surge impedance are mismatched which causes voltage reflections. Voltage reflection further could potentially cause voltage amplification at the motor terminals due to the additive nature of incident and reflected waves.

Smaller horsepower motors have larger inductance and less amount of slot insulation, which results in a larger surge-impedance compared to high horsepower motors. Hence, the mismatch between cable and motor surge impedance is the highest in small motors.

The over-voltage at the motor terminals due to long lead lengths can deteriorate the insulation system of the motor resulting in premature motor failures. Three different techniques are discussed in this section, which help alleviate the over-voltage problem encountered by motors at great distances from drives. They are: (i) Use of load reactors; (ii) Use of RC snubber at the motor terminals; and (iii) Use of an RLC filter where LC forms the dv/dt slope changer and R is across L to damp out the oscillations caused by the LC and cable combination.

By using 3-phase load reactor in between the motor and the PWM inverter, one can change the characteristic impedance of the motor or that of the source depending on where the inductor is physically placed. Adding a load reactor at the motor end will result in altering the surge impedance of the motor. The inductance component of the surge impedance of the motor is artificially made high which causes the overall surge impedance of the motor to be higher than normal. The mismatch between the surge impedance of the motor and the cable is aggravated thereby resulting in a higher coefficient of reflection ($\rho_R$) and a higher voltage at the terminating point. Since the terminating point now has the 3-phase inductor, the over-voltage is experienced by the windings of the inductor instead of the motor. The negative influence of adding an inductor at the motor end is that the reflected voltage traveling along the conductor back to the sending end will now have higher amplitude and will need to be absorbed by the sending end. In many applications, it is impractical to add a mitigation technique at the motor end.

Adding a load reactor at the inverter end will result in altering the surge impedance of the cable. Typically, the surge impedance of the cable is lower than that of the motor. By increasing the surge impedance of the cable artificially, the coefficient of reflection, $\rho_R$ is made lower which reduces the magnitude of the reflected wave. The increase in the effective impedance of the cable can be achieved by placing the inductor at the drive end. Typical value of impedance used is 0.03 p.u based on fundamental ratings.

Artificially increasing the surge impedance of the cable by adding an output inductor at the inverter end also causes the mismatch between the cable surge impedance and the source surge impedance to increase thereby increasing the amplitude of reflected wave at the inverter end. However, the main voltage stress is absorbed by the inductor rather than the VFD.

The RC filter is one of many methods that have been used in the industry. In its simplest form, it consists of resistors and capacitors configured as an RC snubber. The RC snubber is typically installed at the motor terminals and acts as an impedance matching network. Its performance is dependent on the inductance of the cable and is very important in order to predict the effectiveness of this type of filter. The snubber components are carefully selected to absorb the voltage spikes occurring at the motor end due to voltage reflection issues. For transient rising and falling edge of the PWM voltage waveform, the capacitor behaves like a short circuit and allows current to flow through it. The resistor in series with the capacitor dissipates the energy flowing into the RC network and thereby damps out the oscillations. The voltage spikes are thus snubbed by the RC snubber circuit at the motor end.

Though the idea is sound, the value of R and C needed in the snubber circuit depends on the amount of energy that is needed to be dissipated, which in turn depends on the distance between the motor and the drive and the characteristics of the cable. In addition, due to logistical and environmental reasons, it is difficult to access the motor terminals in many applications. Given these facts, the wide spread acceptance of the RC snubber method is limited.

The snubber network is intended to absorb the voltage transients caused by voltage reflection at the motor end. The major disadvantage of this method is that the network is effective only when employed at the motor end. This makes it impractical in many applications since installing it at the motor end may not be possible due to environmental and other logistical concerns. Also, it is necessary to select C properly to effectively absorb the transient. Since the value of the peak voltage at the motor end depends on cable length and cable characteristic, it makes its effectiveness unpredictable. Finally, the value of the damping resistor depends on the value of C used and so it is indirectly dependent on cable characteristics. The wattage of the resistor can also be large depending on the voltage that needs to be absorbed. The heat dissipation in the filter near to the motor terminal needs careful planning and consideration.

The traditional dv/dt filter consists of an RLC filter interposed between the inverter and the induction motor. This method reduces the dv/dt at the motor terminals that help reduce the voltage reflection issue at the motor terminals. It also helps reduce the shaft voltage and common mode current that are important in reducing bearing currents, and conducted EMI to some extent.

The dv/dt filter is used to modify the rise time and fall time of the PWM voltage waveform and unlike adding an inductor alone, the dv/dt filter does not alter either the cable surge impedance or the source surge impedance. Modifying the rise time and fall time using dv/dt filters has limitations since the cable inductance and capacitance influence the final value of the voltage transient at the motor terminals.

There are two types of dv/dt filter. In the first type, an inductor is used at the output of the drive and a capacitor-resistor network is connected either in wye configuration or in delta configuration at the output of the inductor. Motor cable is connected to this output. In this topology (resistor in series with the resonating capacitor), the effectiveness of the circuit is reduced since the series resistor adds impedance to the leakage current, which diminishes the capability of the circuit to shunt the leakage current. Further, the value of the series resistor should be large enough to provide sufficient damping but at the same time should be small to reduce the slope of the voltage across the RC combination. This contradictory requirement makes the choice of a suitable capacitor-resistor combination difficult. The lead length between the inverter and the motor also influences the performance of the circuit. The dv/dt filter with the damping resistor in series with the filter capacitor is shown in FIG. 1.

A popular alternate topology is shown in FIG. 2. In this topology, the damping resistor is placed in parallel across the filter inductor instead of the series RC configuration of FIG. 1.

The advantages of the dv/dt filter with the resistor across the filter inductor are that: the output dv/dt filter is employed at the inverter end and easy to install; this filter reduces the rise time and fall time of PWM Pulses to a mild level (typically 1 µs) both in the normal and common mode voltages; and problems related to the leakage current, shaft voltage and surge voltage at the motor terminal will be mitigated by this filter. Reduced RF noise will be expected to some extent.

The filter shown in FIG. 2 could also have issues when the distance between the motor and the drive is quite long. The capacitance in the cable can also influence the effectiveness of this topology. When the cable capacitance is large, the cable surge impedance is small. The cable surge impedance is now much smaller compared to drive surge impedance in the presence of the R-L filter section of the dv/dt filter shown in FIG. 2. This can cause the reflected voltage at the filter to be higher than usual causing higher power loss in the damping resistor, since the other end of the inductor-resistor combination is clamped to the DC bus.

The present invention is directed to satisfying the requirements discussed above, in a novel and simple manner.

SUMMARY OF THE INVENTION

An improved inverter output filter suitable for use with large power AC motors at long distances nearing 300 m with a built-in resistor fault detection circuit is disclosed herein.

There is disclosed herein in accordance with one aspect an inverter output filter with fault detection comprising a filter circuit connected between an inverter output and an AC induction motor input. The filter circuit comprises an inductor connected between a filter input terminal and a filter output terminal. The damping resistor is connected in series with a blocking capacitor across the inductor. The detection circuit is connected to the capacitor for detecting capacitor voltage to indicate a resistor fault condition.

It is a feature that the resistor and capacitor have an RC time constant selected dependent on turn-on and turn-off time of switches of the inverter.

It is another feature that the detection circuit indicates a resistor fault condition responsive to capacitor voltage being below a select level.

It is a further feature that the detection circuit comprises a rectifier converting capacitor voltage to a DC voltage. The detection circuit may comprise a sensing element electrically connected to a switching device operated to indicate the resistor fault condition.

It is still another feature that the sensing element energizes the switching device if capacitor voltage is above a select voltage level to indicate a normal condition and de-energizes the switching device if capacitor voltage is below the select voltage level to indicate the resistor fault condition.

It is yet another feature that the sensing element comprises a Zener diode and the switching device comprises a relay having a coil. The Zener diode has a Zener voltage in a range of the relay coil's voltage rating.

It is a further feature that the sensing element comprises a linear regulator.

It is an additional feature that the switching device comprises an opto-isolator.

There is disclosed in accordance with another aspect a motor drive system output filter with fault detection. A variable frequency drive (VFD) drives a three phase AC induction motor. A filter circuit is connected between the VFD and the AC induction motor. The filter circuit comprises a filter for each phase. Each filter comprises an inductor and a damping resistor connected in series with a blocking capacitor across the inductor. A plurality of detection circuits are provided, one for each phase. Each detection circuit is connected to the capacitor of the associated phase for detecting capacitor voltage to indicate a resistor fault condition.

Further features and advantage of the invention will be readily apparent from the specification and the drawings.

DETAILED DESCRIPTION OF THE INVENTION

Figure 1:
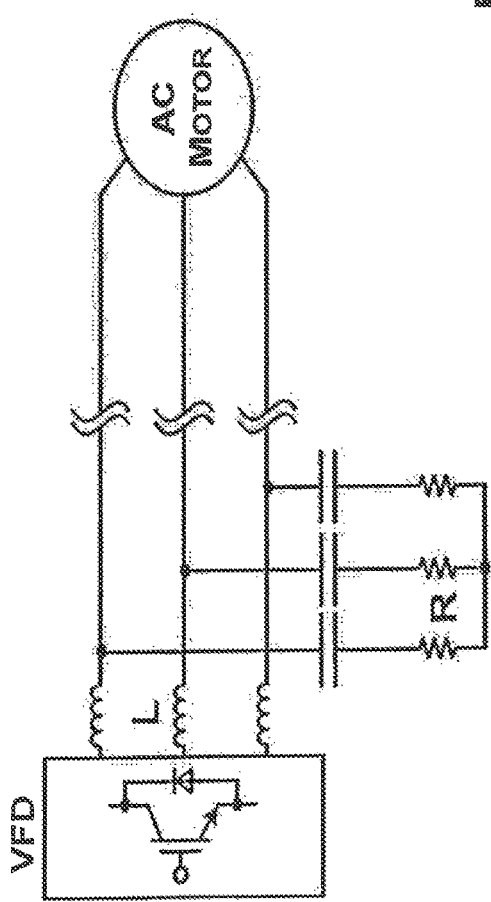
FIG. 1 is a schematic of a prior art motor drive system output filter.
Figure 2:
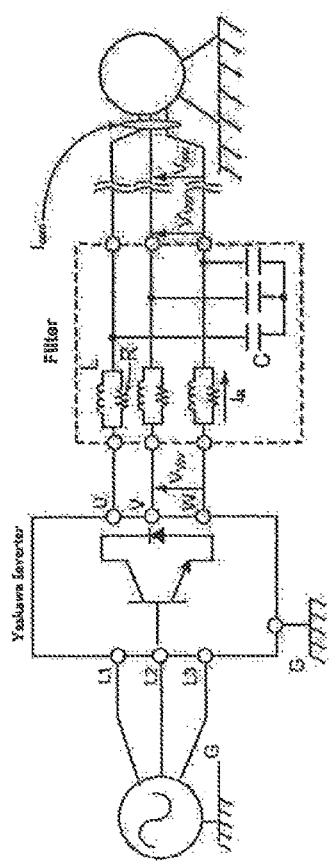
FIG. 2 is a schematic of another prior art motor drive system output filter.

This application relates generally to a normal mode dv/dt filter with resistor failure detection circuit used with a motor drive system. A typical motor drive system includes an AC source (not shown) and a variable frequency drive (VFD) 501, see FIG. 3, for driving an induction motor 507. A control unit (not shown) would be used for controlling the VFD 501. The AC source may comprise an alternate energy source or the like developing three phase AC power. The VFD 501 converts the AC power to DC power and converts it back to AC power at a select frequency which is then impressed across terminals T1, T2 and T3.

The VFD 501 may take various known forms. However, as the invention does not relate to the specific form of the VFD it is not shown in detail in the drawings. An exemplary VFD includes an AC/DC converter connected by a DC link circuit to a DC/AC converter. The typical AC/DC converter comprises a full wave bridge rectifier circuit of conventional construction which is operable to convert three phase AC power to DC power. The DC link circuit comprises a DC bus with a DC bus capacitor connected across the DC bus.

The DC/AC converter may comprise a voltage source inverter. Typically, the inverter comprises a pulse width modulation inverter using solid state switching devices connected in a three phase bridge configuration to the DC bus to develop power at the terminals T1, T2 and T3. The switches are pulse width modulated by control signals using a conventional control scheme. Particularly, the PWM inverter is controlled to create a sinusoidal effect for the induction motor 507. The pulse frequency is typically fixed. The pulse width is varied to various sinusoidal frequency.

As described above, the voltage source inverter may use wide band gap devices (SiC and GaN) for power semiconductor switches. These devices have extremely fast rise time and fall time in the order of nanoseconds.

As mentioned in the Background, the coefficient of reflection at the sending end ($\rho_S$) is generally assumed to be zero due to low value of source impedance. When an inductor is used at the output of the drive, the value of cable surge impedance artificially increases. Voltage reflection can then be observed to occur at the sending end on the load side of the output inductor. The high voltage spike appears at the load side of the output inductor and so the inductor has to absorb the difference in the voltage between the output and input terminals of the inductor.

In one of the traditional mitigation technique, a damping resistor is added in parallel across the output inductor, which is used for modifying the dv/dt or slope of the sending end voltage. Doing so effectively reduces the cable surge impedance and brings it back closer to the original low value. However, the voltage experienced by the damping resistor which is in parallel with the output inductor can still reach high levels causing excessive heat to be dissipated in the resistor, especially when the distance between the motor and the drive exceeds approximately 100 m. An unusually high cable parasitic capacitance (conductor to ground) can also increase the voltage being reflected back and cause high voltage to appear across the damping resistor that is in parallel across the filter inductor. In both these cases, the reflected voltage at the load side of the filter inductor can reach high values requiring the resistor to absorb the difference between the DC bus voltage and the reflected peak voltage. The power loss in the resistor increases and will have to be rated correctly.

One way to reduce the voltage stress across the resistor is to add a capacitor in series with the resistor. The capacitor will allow only the transient voltage to go through while it will block most of the normal mode voltage. The reduced stress across the resistor results in lower power that the resistor has to dissipate. The power rating of the resistor can be reduced and the combination can be made to handle long cable lengths and cables with abnormally high conductor-ground parasitic capacitance.

Figure 3:
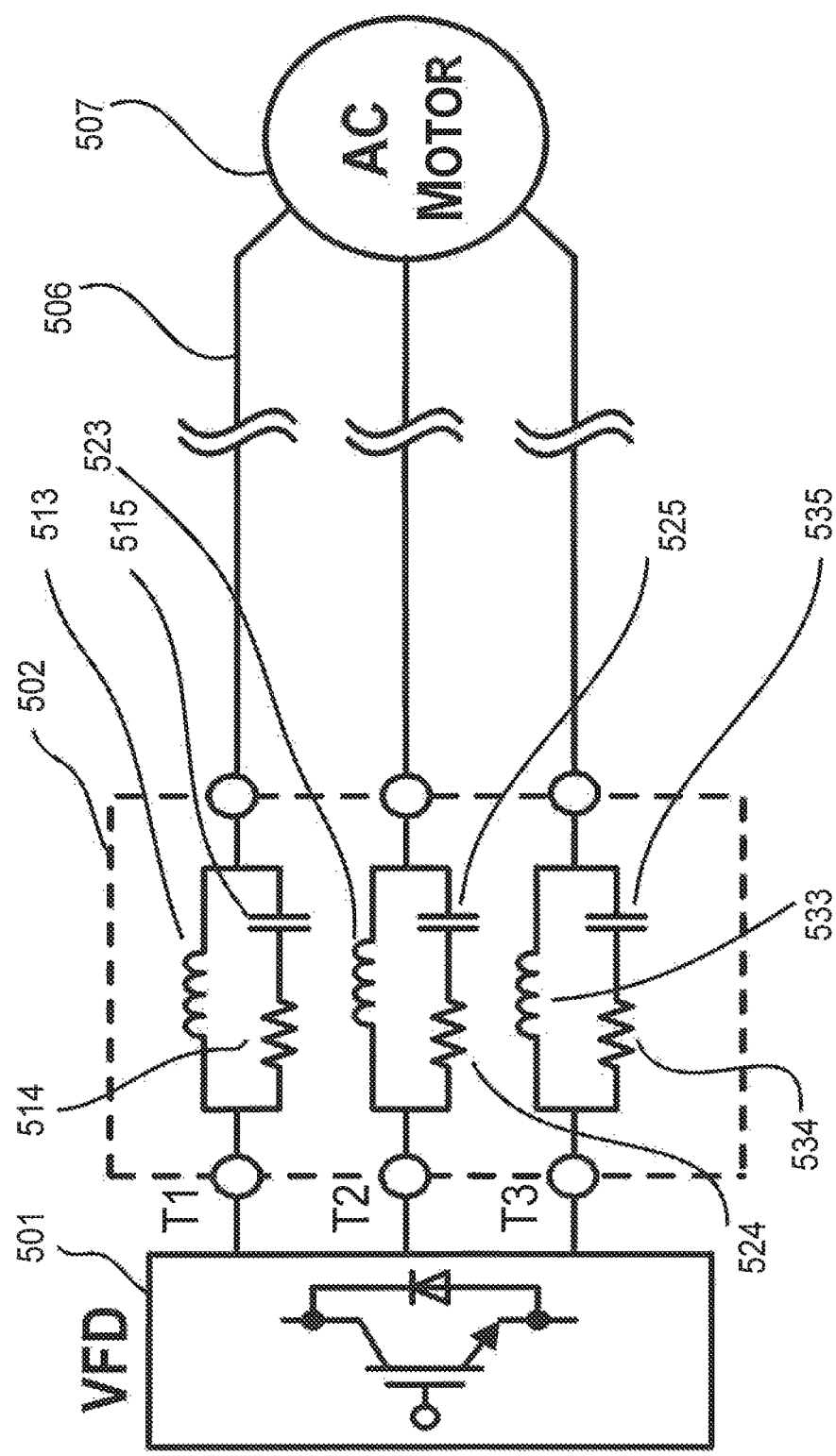
FIG. 3 is a schematic for a motor drive system output filter in accordance with the invention.

A new three phase dv/dt filter topology in accordance with the invention is shown in FIG. 3. The output terminals T1, T2 and T3 of the VFD 501 are connected to a dv/dt filter circuit 502. The dv/dt filter circuit 502 is connected via cables 506 to the motor 507. For the first phase the dv/dt filter circuit 502 includes an inductor 513 connected to the first terminal T1. A series connected resistor 514 and capacitor 515 are connected in parallel across the inductor 513. For the second phase the dv/dt filter circuit 502 includes an inductor 523 connected to the second terminal T2. A series connected resistor 524 and capacitor 525 are connected in parallel across the inductor 523. For the third phase the dv/dt filter circuit 502 includes an inductor 533 connected to the third terminal T3. A series connected resistor 534 and capacitor 535 are connected in parallel across the inductor 533.

The operation of the filter circuit 502 is identical for all three phases, so the discussion below only references the first phase inductor 513, resistor 514, and capacitor 515. It should be noted that a higher value of capacitor 515 will cause more voltage to appear across the resistor 514 and practically defeats the purpose of adding capacitance to limit the rms voltage across the resistor 514. On the other hand, a lower capacitance value does not allow the energy associated with the pulsed voltage to travel into the resistor 514 where it is dissipated. Hence there needs to be a balance when selecting the capacitor 515 in the RC network of the proposed filter.

The next step in determining the value of the resistor 514 and capacitor 515 is the time constant of the RC network, defined as the product of R and C. This factor determines how fast and how much of the energy in the voltage spike travels into the RC network for dissipation. In other words, the time constant depends on the turn-on and turn-off times of the IGBT switches being used in the VFD 501.

Practically, the reference time constant depends on the observed output dv/dt waveform of the VFD 501 under load condition as provided by the VFD manufacturer. Under worst case scenario, it should be assumed that a voltage pulse rises from zero to the nominal DC bus voltage and immediately is turned off back to the zero volt position. This spike would create a travelling wave coming back to the filter circuit 502 from the motor end with amplitude equal to two times the DC bus voltage. Effectively, the RC time constant should be such that the sum of rise time and fall time should be safely accommodated so that the spike easily travels into the resistor 514 capacitor 515 network where it is dissipated. As mentioned the actual value chosen will depend on the VFD 501 being used and its associated dv/dt value. Smaller drives will typically have shorter rise and fall times.

The time constant gives the product of R and C but does not suggest the actual value of either the resistor 514 or capacitor 515. For a given value of time constant, one can select various values of R and C to satisfy the time constant requirement. A strategy is needed to determine the actual value of R and C. In order to determine the value of R, one needs to know the value of output inductor 513 being used and the approximate value of the expected capacitance of the cable 506. As expected, this technique also depends on the cable parameters and the distance between the motor 507 and the VFD 501. For a known value of output filter inductance on the inductor 513 and expected capacitance of the cable 506, the value of the damping resistor 514 is determined using the classical technique as follows:

The damping coefficient, ζ, for the lumped topology that includes the output filter inductor 513 is:

$$\zeta = \frac{\sqrt{(L_F + L_{CABLE})/C_{CABLE}}}{2R} \qquad \text{Equation 1}$$

For the damping coefficient to be greater than 1, the denominator has to be less than the numerator. In other words, for an over-damped system, the value of R should be:

$$R \leq \frac{\sqrt{(L_F + L_{CABLE})/C_{CABLE}}}{2} \qquad \text{Equation 2}$$

With the value of R for the damping resistor 514 as determined in (Equation 2) above, and for a desired time constant, one can determine the value of the blocking capacitor 515 needed to achieve the desired performance.

An additional benefit of adding a capacitor in series with the resistor is that the voltage across the capacitor 515 can be used for sensing a resistor failure condition. Typically, damping resistors fail due to thermal stress, resulting in an open circuit condition. When this happens, no current flows through the RC network and hence the voltage across the capacitor goes to zero.

Figure 4:
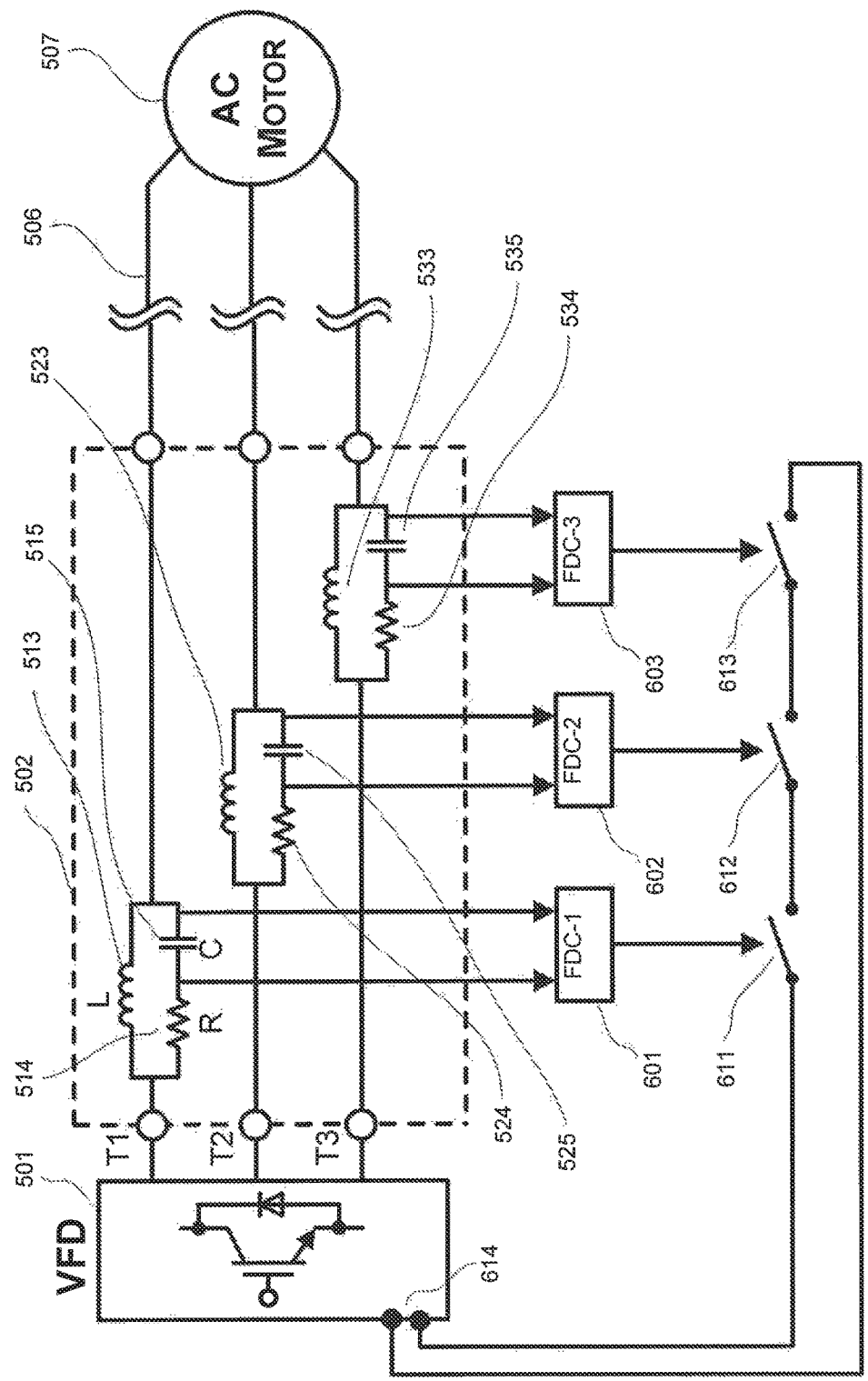
FIG. 4 is a schematic for a motor drive system output filter, similar to FIG. 3, including a plurality of detection circuits.

Since the voltage across the dv/dt filter capacitor 515 is made up of mainly PWM spikes, the disclosed method is to rectify this voltage and convert it into a detectable DC voltage level. This general method is shown in FIG. 4. FIG. 4 uses the same reference numerals as those in FIG. 3. Elements 601, 602, and 603 represent the resistor fault detection circuits (FDC) connected across the respective capacitors 515, 525 and 535. Elements 611, 612, and 613 represent switching devices operated by the respective FDCs 601, 602 and 603. The FDC 601 is constructed to be identical to the FDCs 602 and 603, except for phase location. Likewise, the switching device 611 is constructed identically to the switching devices 612 and 613, except for phase location. In the interest of succinct discussion and explanation, only 601 and 611 and the dv/dt filter 502 circuit elements of the T1 phase are referenced below.

Fault(s) on the damping resistors 514, 524, and 534 are determined if the DC voltage realized after rectifying the blocking capacitors 515, 525, and 525, respectively, is lower than a predetermined low value. Switching devices 611, 612, and 613 on each phase are ultimately energized, by way of fault detection circuits 601, 602, and 603 from voltage on the dv/dt filter capacitors 515, 525, and 535 during normal operation, with the VFD 501 running and intact filter resistors 514, 524, and 534. The voltage on the capacitors 515, 525, and 535 must exceed the predetermined low value in order to ultimately energize the switching devices 611, 612, and 613. FIG. 4 illustrates normally open switching devices 611, 612, and 613 connected in series to an input 614 of the VFD 501. The switching devices 611, 612, and 613 are energized and switched to a closed state during normal operation with the VFD 501 running. The VFD 501 is programmed to generate an alarm or trip if one or more of the switching devices 611, 612, and 613 open while the VFD 501 is running.

Figure 5:
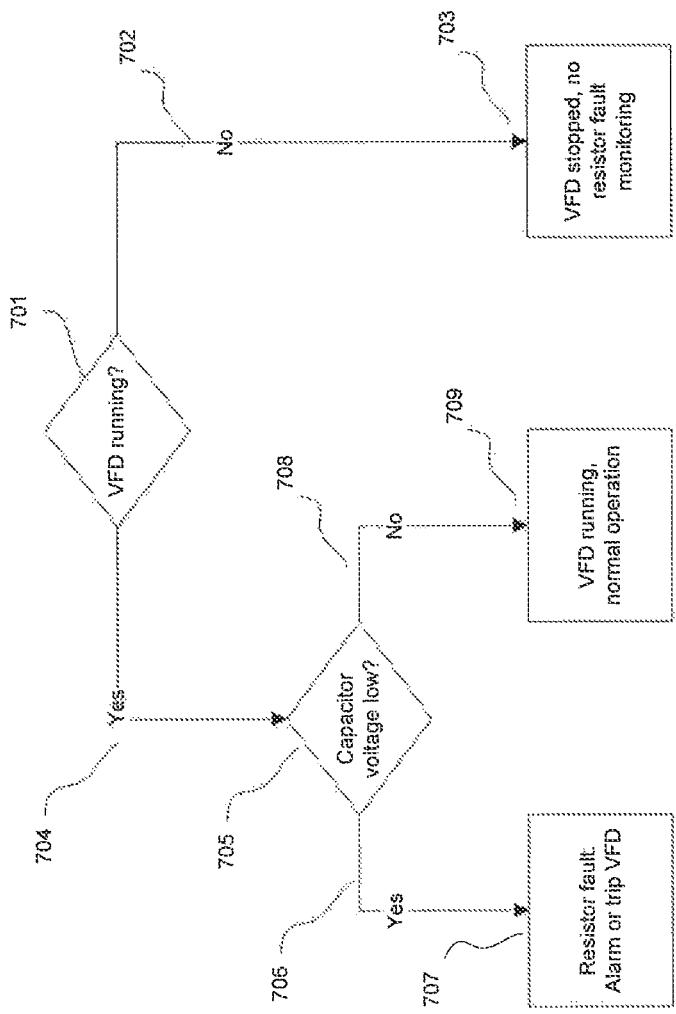
FIG. 5 is a flow diagram illustrating operation of the detection circuit.

FIG. 5 comprises a flowchart showing the resistor fault detection method and logic utilized in the FDCs 601, 602 and 603 of FIG. 4. As illustrated by the top decision box 701, the switching devices that are energized by the capacitor voltage only need to be monitored while the VFD 501 is running. When the VFD 501 is not running as at a line 702, the voltage on the capacitors 515, 525, and 535 naturally go to zero, and the switching devices 611, 612, and 613 are de-energized. In this situation, it is presumed that switching devices are de-energized due to normal voltage decay on the capacitors, and not because faults on the resistors 514, 524, and 534. No resistor fault monitoring is performed, as indicated at a block 703.

When the VFD 501 is running, as at a line 704, the switching devices 611, 612, and 613 are monitored in order to verify that the voltages on the capacitors 515, 525, and 535 are all higher than the predetermined low value as determined at a decision block 705. If the switching devices are energized, and it is determined that the capacitor voltage is not below the minimum predetermined value at a line 708, then the operating condition is deemed normal at a block 709. If, however, one or more switches are not energized while the VFD is running, the presumption is that the voltage on one or more capacitors 515, 525, and 535 fell below the predetermined low value at a line 706 due to an open circuit resistor fault condition. The VFD 501 is then tripped, or an alarm is created at a block 707.

One skilled in the art will recognize that various switching devices, normally open or normally closed, may be used without departing from the scope of invention, provided that the appropriate logic arrangement is utilized. An interface relay or supervisory control and data acquisition (SCADA) system may also be optionally added to generate a system fault or alarm in the event of a change in state of one or more of the switching devices, indicative of a resistor failure. Two embodiments of this general resistor failure detection circuit are presented herewith.

Figure 6:
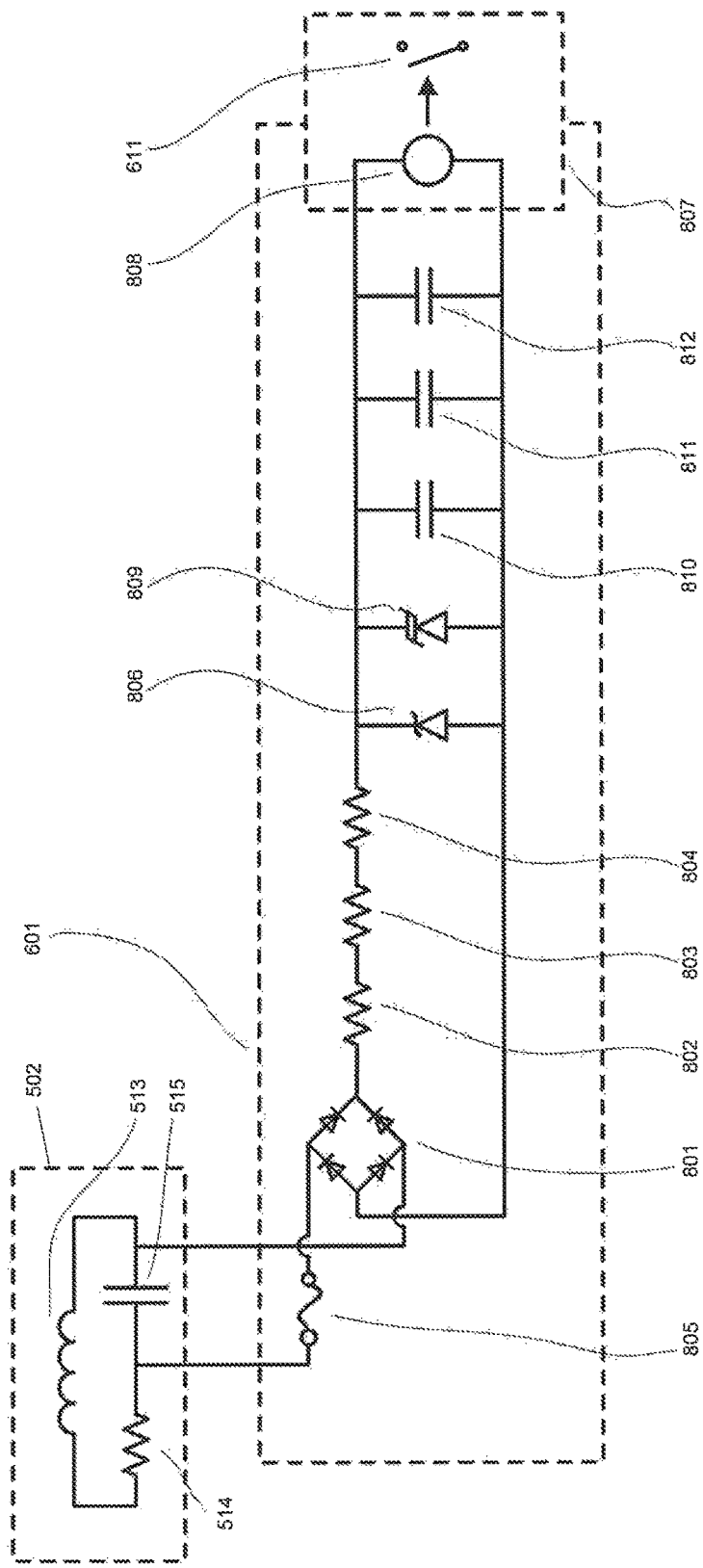
FIG. 6 is an electrical schematic of a detection circuit in accordance with a first embodiment.

FIG. 6 illustrates a schematic for the first FDC 601 in accordance with a first embodiment. The resistor fault detection circuit on each phase rectifies the dv/dt filter capacitor voltage, delivers it to a voltage divider network comprising one or more resistors and a Zener diode, and then ultimately uses the voltage from the Zener diode to energize a switching device while running, during normal operation.

The FDC 601 comprises a rectifier 801 connected across the capacitor 515 via a fuse 805. The rectifier 801 is connected via series connected current limiting resistors 802, 803 and 804 to a Zener diode 806. Connected across the Zener diode 806 is a relay 807, including a coil 808. Filtering devices for the relay coil 808 comprise a transient voltage suppression (TVS) diode 809 and relay voltage filter capacitors 810, 811, and 812. The capacitors 810, 811, and 812 are distinct from the filter power capacitor 515. The coil 808 operates the switch 611.

The dv/dt filter power capacitors 515, 525, and 535 and fault detection circuits 601, 602, and 603 from all three phases are preferably mounted all together on a single printed circuit board (PCB) to minimize electrical noise and overall footprint. However, multiple PCBs and suitable linking cable harnesses could also be utilized for mounting the necessary components. The fault detection circuit elements are identical between each of the three phases. Therefore, only the functionality of the T1-phase fault detection circuit 601 is described herewith.

A well-known H-Bridge rectifier configuration 801, converts the AC waveform on the filter capacitor 515 to DC voltage. Selection of the rectifier 801 should consider the expected dv/dt filter capacitor 515 peak voltage, which is a function of the motor cable length and characteristics. The necessary current rating for the rectifier 801 is largely dependent on the selection of the current limiting resistors 802, 803, and 804. Discrete components may also be used to form the rectifier without departing from the scope of the invention. The fuse 805 may be optionally included in the event of rectifier 801 failure in short circuit mode.

The Zener diode 806, clamps the voltage at the switching relay 807. An appropriately selected relay will provide sufficient isolation between the coil voltage, which is ultimately referenced to the VFD's 501 DC bus, and the signal voltage at the switching contacts 611. The Zener diode 806 is selected to have a Zener voltage in the range of the relay coil 808 voltage rating. The power dissipation rating of the Zener diode 806 must be sufficiently high to permit rated coil current to be delivered to the relay coil 808 without overheating the Zener diode 806.

The current limiting resistors 802-804 are separate and distinct from the dv/dt filter power resistor 514. Since the Zener diode 806 clamps the voltage in parallel with the relay coil 808 to the Zener voltage, the difference of the rectifier 801 voltage and the Zener 806 voltage is dissipated across the series combination of the resistors 802-804. The power dissipation across the resistors 802-804 is determined by the equation below, where VD1, VD2, and R1-R3 are the rectifier 801 output voltage, Zener 806 voltage, and total resistance of the resistor series combination 802-804, respectively:

$$P_{R1-R3} = \frac{(V_{D1} - V_{D2})^2}{R_{R1-R3}}$$

As the equation indicates, the power dissipation across the resistors 802-804 varies inversely with total resistance of the series combination. If the resistance is too low, the resistor 802-804 power ratings may be exceeded. However, for proper performance of the fault detection circuit 601, there is also a maximum resistance that may be selected. The rated Zener voltage may not be present on the Zener diode 806, and therefore, also missing on the relay coil 808, if the current on the Zener diode 806 falls below the Zener current rating. This then results in voltage on the relay coil 808 insufficient for engaging the relay 807 during normal operation. The resistance selection, therefore, must be large enough to avoid excessive power dissipation and heating, yet small enough to ensure that at least rated Zener current flows into the Zener diode 806 throughout the range of possible dv/dt filter capacitor voltage levels during typical operating conditions.

One skilled in the art will recognize that the series combination of the resistors 802-804 could be consolidated into a single resistor without departing from the scope of the invention.

As indicated by the general circuit diagram of FIG. 4, this first embodiment of the resistor fault detection circuit is utilized on each phase of the dv/dt filter 502, and is identical on all three phases. The relay contacts from each phase may be linked together through a series arrangement or other suitable configuration to provide a single fault status input to the VFD 501, optionally, by way of an interfacing relay or SCADA system. Furthermore, an alternate switching device may be utilized, in place of the relay 807, provided that considerations are made for the device turn-on voltage and decay time when selecting the other components, and that sufficient isolation is achieved between device input voltage, referenced to the VFD's 501 DC bus, and the signal voltage at the switching device contacts 611.

Figure 7:
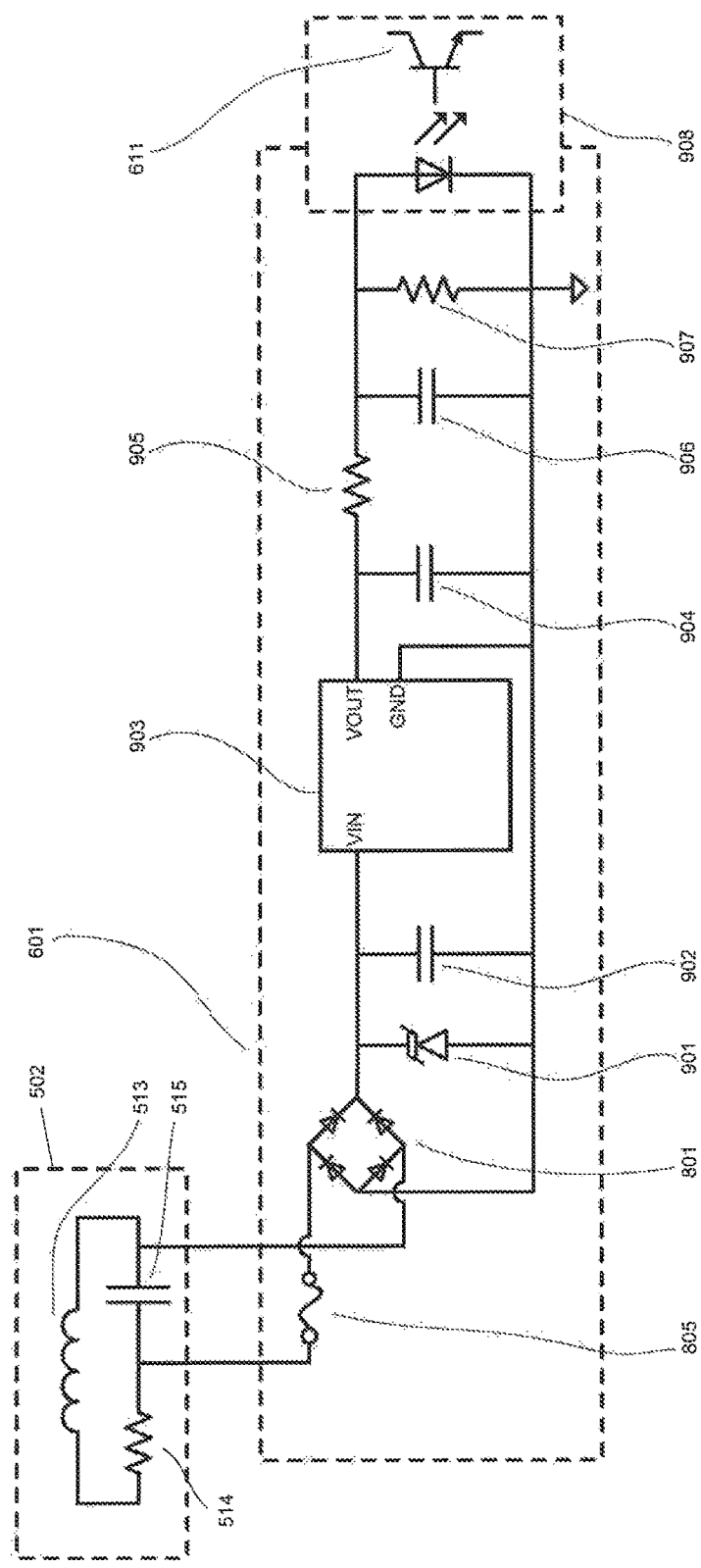
FIG. 7 is an electrical schematic of the detection circuit in accordance with a second embodiment.

A single phase representation of a second embodiment, stemming from the T1 phase of the dv/dt filter 502, is shown in FIG. 7. In the second embodiment, a resistor failure detection circuit on each phase rectifies the dv/dt filter capacitor voltage and delivers it to a linear regulator. The linear regulator supplies an output voltage sufficient to ultimately energize a switching device.

In the second embodiment of FIG. 7, like reference numerals are used for like elements relative to the first embodiment. The FDC 601 comprises the rectifier 801 connected across the capacitor 515 via the optional fuse 805. The rectifier 801 is connected to the input of a linear regulator 903. A TVS diode 901 and a capacitor 902 are connected across the input to the linear regulator 903. A capacitor 904 is provided at the output of the linear regulator 903 to provide voltage stability.

As with the first embodiment, the dv/dt filter power capacitors 515, 525, and 535 and fault detection circuits 601, 602, and 603 from all three phases are preferably mounted all together on a single printed circuit board (PCB) to minimize electrical noise and overall footprint, although it is not required to do so to achieve proper functionality. The fault detection circuit elements are identical between each of the three phases. Therefore, only the functionality of the T1-phase fault detection circuit 601 is described herewith.

The H-Bridge rectifier 801 converts the AC waveform on the filter capacitor 515 to a time-changing DC voltage. The fuse 805 may be optionally included in the event of rectifier failure in short circuit mode.

The described system provides numerous benefits. To reduce power loss in the damping resistor 514 placed across the output inductor 513, a capacitor 515 is added in series. The capacitor 515 blocks the DC component of a PWM pulse but allows the transient spike to go through. The blocking of the PWM pulse reduces the rms voltage appearing across the resistor 514 and thereby reduces the power loss in the resistor 514. By removing the shunt filter capacitor, the interaction of the filter components with the parasitic inductance and capacitance of the cable is significantly reduced, allowing the use of this type of filter 502 with cables having higher than normal parasitic capacitance. It also helps in allowing the motor 507 to be placed at longer distances (up to about 300 m) from the VFD 501. By adding the blocking capacitor 515, it is now possible to monitor the voltage across the capacitor 515 to determine the health of the damping resistor 514.

An easy way of monitoring the voltage across the capacitor 515 is suggested wherein the voltage is rectified and compared with a predetermined low value. If the voltage falls below this low value, it is understood that the resistor has failed in an electrically open state. This event is used to trigger an external fault in the VFD and thereby stop the VFD.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible.

The foregoing disclosure of specific embodiments is intended to be illustrative of the broad concepts comprehended by the invention.

The invention claimed is:

1. An inverter output filter with fault detection comprising:
   a filter circuit connected between an inverter output and an AC induction motor input, the filter circuit comprising an inductor connected between a filter input terminal and a filter output terminal, and a resistor connected in series with a capacitor across the inductor, and
   a detection circuit connected to the capacitor for detecting capacitor voltage to indicate a resistor fault condition.

2. The inverter output filter of claim 1 wherein the resistor and capacitor have an RC time constant selected dependent on turn-on and turn-off times of switches of the inverter.

3. The inverter output filter of claim 1 wherein the detection circuit indicates a resistor fault condition responsive to capacitor voltage being below a select level.

4. The inverter output filter of claim 1 wherein the detection circuit comprises a rectifier converting capacitor voltage to a DC voltage.

5. The inverter output filter of claim 4 wherein the detection circuit comprises a sensing element electrically connected to a switching device operated to indicate the resistor fault condition.

6. The inverter output filter of claim 5 wherein the sensing element energizes the switching device if capacitor voltage is above a select voltage level to indicate a normal condition and de-energizes the switching device if capacitor voltage is below the select voltage level to indicate the resistor fault condition.

7. The inverter output filter of claim 5 wherein the sensing element comprises a Zener diode and the switching device comprises a relay having a coil.

8. The inverter output filter of claim 7 wherein the Zener diode has a Zener voltage in a range of the relay coil's voltage rating.

9. The inverter output filter of claim 5 wherein the sensing element comprises a linear regulator.

10. The inverter output filter of claim 5 wherein the switching device comprises an opto-isolator.

11. A motor drive system output filter with fault detection comprising:
    a variable frequency drive (VFD) for driving a three phase AC induction motor;
    a filter circuit connected between the VFD and the AC induction motor, the filter circuit comprising a filter for each phase, each said filter comprising an inductor and a resistor connected in series with a capacitor across the inductor, and
    a plurality of detection circuits, one for each phase, each connected to the capacitor of the associated phase for detecting capacitor voltage to indicate a resistor fault condition of the associated phase.

12. The motor drive system output filter of claim 11 wherein the resistor and capacitor have an RC time constant selected dependent on turn-on and turn-off times of switches of the VFD.

13. The motor drive system output filter of claim 11 wherein each detection circuit indicates a resistor fault condition responsive to capacitor voltage being below a select level.

14. The motor drive system output filter of claim 11 wherein each detection circuit comprises a rectifier converting capacitor voltage to a DC voltage.

15. The motor drive system output filter of claim 14 wherein each detection circuit comprises a sensing element electrically connected to a switching device operated to indicate the resistor fault condition.

16. The motor drive system output filter of claim 15 wherein the sensing element energizes the switching device if capacitor voltage is above a select voltage level to indicate a normal condition and de-energizes the switching device if capacitor voltage is below the select voltage level to indicate the resistor fault condition.

17. The motor drive system output filter of claim 15 wherein the sensing element comprises a Zener diode and the switching device comprises a relay having a coil.

18. The motor drive system output filter of claim 17 wherein the Zener diode has a Zener voltage in a range of the relay coil's voltage rating.

19. The motor drive system output filter of claim 15 wherein the sensing element comprises a linear regulator.

20. The motor drive system output filter of claim 15 wherein the switching device comprises an opto-isolator.

* * * * *